(12) United States Patent
Sworowski et al.

(10) Patent No.: US 7,839,239 B2
(45) Date of Patent: Nov. 23, 2010

(54) MEMS RESONATOR HAVING AT LEAST ONE RESONATOR MODE SHAPE

(75) Inventors: Marc Sworowski, Caen (FR); Patrice Gamand, Douvres la Delivrande (FR); Pascal Philippe, Caen (FR)

(73) Assignee: NXP B.V., Eindhoven (NL)

( * ) Notice: Subject to any disclaimer, the term of this patent is extended or adjusted under 35 U.S.C. 154(b) by 259 days.

(21) Appl. No.: 12/281,985

(22) PCT Filed: Mar. 8, 2007

(86) PCT No.: PCT/IB2007/050770
§ 371 (c)(1),
(2), (4) Date: Sep. 6, 2008

(87) PCT Pub. No.: WO2007/102130

PCT Pub. Date: Sep. 13, 2007

(65) Prior Publication Data

US 2010/0156569 A1   Jun. 24, 2010

(30) Foreign Application Priority Data

Mar. 9, 2006   (EP)   ................................. 06110892

(51) Int. Cl.
*H03H 9/46*   (2006.01)
*H03H 9/52*   (2006.01)
*H03B 5/30*   (2006.01)

(52) U.S. Cl. .................. 333/186; 438/50; 438/386; 310/309; 331/154

(58) Field of Classification Search .......... 333/186, 333/199; 331/116 R, 154; 438/50, 386, 438/389; 310/309
See application file for complete search history.

(56) References Cited

U.S. PATENT DOCUMENTS

| | | | | |
|---|---|---|---|---|
| 3,634,787 A | * | 1/1972 | Newell | ................ 333/186 |
| 6,136,630 A | * | 10/2000 | Weigold et al. | ............ 438/50 |
| 6,429,755 B2 | * | 8/2002 | Speidell et al. | ............ 333/197 |

(Continued)

FOREIGN PATENT DOCUMENTS

| DE | 19852878 A1 | 5/2000 |
|---|---|---|
| EP | 1475856 A1 | 11/2004 |

OTHER PUBLICATIONS

Pourkamali Siavash et al; "High-Q Single Crystal Silicon Harpss Capacitive Beam Resonators With Self-Aligned Sub-100-NM Transduction Gaps". Journal of Microelectromechanical Systems, vol. 12, No. 4, Aug. 2003, pp. 487-496.

(Continued)

*Primary Examiner*—Barbara Summons

(57) ABSTRACT

The invention relates to a MEMS resonator having at least one mode shape comprising: a substrate (2) having a surface (12), and a resonator structure (1), wherein the resonator structure (1) is part of the substrate (2), characterized in that the resonator structure (1) is defined by a first closed trench (3) and a second closed trench (3), the first trench (3) being located inside the second trench (3) so as to form a tube structure (1) inside the substrate (2), and the resonator structure (1) being released from the substrate (2) only in directions parallel to the surface (12). The invention further relates to a method of manufacturing such a MEMS resonator.

12 Claims, 9 Drawing Sheets

U.S. PATENT DOCUMENTS

| | | | |
|---|---|---|---|
| 6,856,217 | B1 | 2/2005 | Clark et al. |
| 7,323,952 | B2 * | 1/2008 | Pan et al. ................... 333/186 |
| 7,436,271 | B2 * | 10/2008 | Weinstein et al. ........... 333/186 |
| 2004/0065940 | A1 * | 4/2004 | Ayazi et al. ................. 257/528 |
| 2004/0207492 | A1 * | 10/2004 | Nguyen et al. .............. 333/199 |
| 2005/0206479 | A1 * | 9/2005 | Nguyen et al. .............. 333/186 |
| 2007/0070821 | A1 * | 3/2007 | Weigold ..................... 368/168 |

OTHER PUBLICATIONS

Roozeboom F et al; "More Than 'Moore': Towards Passive and System-In-Package Integration". Electrochem. Soc. Symp. Proc., vol. 2005-8, Jun. 2, 2005, pp. 16-31.

Hao Zhili et al; "VHF Single-Crystal Silicon Elliptic Bulk-Mode Capacitive Disc Resonators—Part I: Design and Modeling". Journal of Microelectromechanical Systems, vol. 13, No. 6, Dec. 2004, pp. 1043-1053. USA.

Pourkamali Siavash et al; "Electrostatically Coupled Micromechanical Beam Filters", Micro 17th IEEE International Conference on Electro Mechanical Systems, 2004. pp. 584-584. Piscataway, NJ, USA.

Bannon III Frank D et al; "High-Q HF Microelectromechanical Filters". IEEE Journal of Solid-state Circuits, vol. 35, No. 4, Apr. 2000. pp. 512-526. Piscataway, NJ, USA.

Ayazi F; "The Harpss Process for Fabrication of Precision MEMS Inertial Sensors". Mechatronics, Pergamon Press, Oxford, GB, vol. 12, No. 9-10. pp. 1185-1199, copyright 2002 Published by Elsevier Science Ltd.

* cited by examiner

MEMS RESONATOR HAVING AT LEAST ONE RESONATOR MODE SHAPE

The invention relates to a MEMS resonator having at least one resonator mode shape, the MEMS resonator comprising a substrate having a surface, and a resonator structure. The invention also relates to a method of manufacturing such a MEMS resonator. The invention further relates to a MEMS oscillator comprising such a MEMS resonator. The invention also relates to a MEMS filter comprising such a MEMS resonator.

Various MEMS resonator geometries and fabrication process are reported in literature in order to replace the bulky quartz crystals used in oscillators (or filters). Integration in a semiconductor process allows drastic size and cost reductions.

MEMS resonators are made of polysilicon or single-crystal silicon. Single-crystal silicon is a more attractive material compared to polysilicon due to its low internal friction and consequently higher mechanical quality factor, low internal stress and independence of various process parameters. Nevertheless, micromachining of single-crystal silicon either requires a specific silicon wafer such as silicon-on-insulator (SOI), which increases the cost and limits further integration, or the use of specific processes, such as the HARPSS or BOSCH process, which also limits the compatibility with MOS or passive processes and therefore results in a limitation of the resonator thickness.

Different concepts are used to make a MEMS resonator: flexural mode of thin beams, disks or membranes (thickness typically smaller than 6 microns), and bulk acoustic mode of relatively thicker beams, plates, or disks (thickness typically smaller than 18 microns). A major drawback of flexural mode resonators is the low power handling due to their low mass at frequencies above 10 MHz. This is particularly true when resonators are made through the HARPSS or BOSCH process, because under-cutting a wide mechanical structure is an issue once it is laterally defined. Disks based on the extensional mode are promising in terms of power handling.

U.S. Pat. No. 6,856,217B1 discloses a micromechanical resonator device based upon a radially or laterally vibrating disk structure and capable of vibrating at frequencies well past 100 MHz. The center of the disk is a nodal point, so when the disk resonator is supported at its center, anchor dissipation to the substrate is minimized, allowing this design to retain high-Q at high frequency. In addition, this design retains high stiffness at high frequencies and so maximizes dynamic range. Furthermore, the sidewall surface area of this disk resonator is often larger than that attainable in previous flexural-mode resonator designs, allowing this disk design to achieve a smaller series motional resistance than its counterparts when using capacitive (or electrostatic) transduction at a given frequency. The frequency and dynamic range attainable by this resonator makes it applicable to high-Q RF filtering and oscillator applications in a wide variety of communication systems. Its size also makes it particularly suited for portable, wireless applications, where if used in large numbers, such a resonator can greatly lower the power consumption, increase robustness, and extend the range of application of high performance wireless transceivers. U.S. Pat. No. 6,856,217B1 does not disclose a single crystal silicon MEMS resonator.

A drawback of the known MEMS resonator is that it is not suitable for frequencies in the range of 10-50 MHz when manufactured in cheap bulk substrates. The required area of the disk resonator needs to be very large for achieving frequencies in the range 10-50 MHz. Processes like HARPPS or BOSCH for manufacturing the MEMS resonator can then no longer be used. The HARPSS process is disclosed in the following disclosure: Siavash Pourkamali, et. al. "*High-Q Single Crystal Silicon HARPSS Capacitive Beam Resonators With Self-Aligned Sub-100-nm Transduction Gaps*", Journal of Microelectromechanical Systems, Vol. 12, No. 4, August 2003, p. 487-496.

It is an object of the invention to provide an improved MEMS resonator and an improved method of manufacturing such a MEMS resonator.

The invention is defined by the independent claims. The dependent claims define advantageous embodiments.

The object of the invention is achieved in that the resonator structure is part of the substrate, and the invention is further characterized in that the resonator structure is defined by a first closed trench and a second closed trench, the first trench being located inside the second trench so as to form a tube structure inside the substrate, and the resonator structure being released from the substrate only in directions parallel to the surface. The MEMS resonator according to the invention formed by the two closed trenches thus provides a very simple structure, which can be manufactured in very cheap substrates. There is no more need for any sacrificial layer under the resonator structure, which is the case in a silicon-on-insulator substrate for example, which means that the MEMS resonator can be manufactured in bulk substrates. All that is needed is to form two closed trenches, one inside the other, which results in a tube structure. Furthermore, the tube structure results in a lower stiffness than the disk structure, which results in a size reduction for a given frequency.

The MEMS resonator according to the invention provides additional advantages. First of all, the tube structure provides the opportunity to tune the electrical performance of the resonator in a better way. Contrary to the beam and disk resonators, which have a frequency that depends on the thickness, the length and the radius, the tube frequency can be tuned by changing the length, the size (being the radius/width of the outer trench) or the thickness (being the distance between the outer and the inner trench) of the tube.

Furthermore, the tube can be designed to have any desired length. Thus, the sidewall area of the tube can be designed to be in the same range or larger than the equivalent disk manufactured in a SOI wafer. In addition, due to the closed shape of the resonator, which makes it more rigid, the sidewall area of the tube is much larger than that of the equivalent beam resonator manufactured in either a SOI wafer or using the HARPSS or BOSCH processes. The consequence of this is that actuator electrodes can also have a larger area, which leads to a lower motional resistance of the device.

The method of manufacturing a MEMS resonator according to the invention is compatible with many conventional processes, like the PICS process. U.S. Pat. No. 6,856,217B1, on the contrary, discloses a complex method of manufacturing a MEMS resonator comprising a combination of layer deposition steps on a substrate, layer patterning steps and selective removal steps in order to create a movable element for the MEMS resonator. Such a process is not compatible with most conventional processes, like the PICS process.

An advantageous embodiment of the MEMS resonator according to the invention is characterized in that the substrate is a single-crystal silicon substrate. Single-crystal silicon is a more attractive material compared to polysilicon due to its low internal friction and consequently higher mechanical quality factor, low internal stress and independence of various process parameters. Thus, an improved performance of the MEMS resonator is achieved.

A further embodiment of the MEMS resonator according to the invention is characterized in that the first closed trench and the second closed trench have a circular shape so as to form a circular tube structure. Disks and thus also circular tubes provide good power handling of the MEMS resonators. In addition, circular shapes are easy to manufacture in most processes.

In an improvement of the last-mentioned embodiment of the MEMS resonator according to the invention, the first closed trench and the second closed trench are located concentrically with respect to each other so as to form the tube structure in such a manner that it has a constant thickness in all radial directions parallel to the surface. The thickness in all radial directions of the tube in this embodiment is constant, as a result of which this embodiment is advantageous to make a narrow-band resonator (typically used in an oscillator) in case the Young's modulus of the substrate is the same in those directions.

Preferably, the height of the tube structure, the height being defined by the depth of said first and second closed trenches, is more than two times the thickness of the tube structure. In this embodiment, the resonance frequency falls within the frequencies needed for certain wireless applications, for example 10 MHz to 50 MHz. The larger the height to thickness ratio, the lower the resonance frequency. Here it must be noted that it is not very attractive to make the known disk resonator such that it resonates at those frequencies. The area of such a disk resonator would become too large.

An alternative embodiment of the MEMS resonator according to the invention is characterized in that the first and second closed trenches are non-circular so as to form a tube structure having a varying thickness in radial directions parallel to the surface for compensating for a difference in the Young's modulus of the substrate material in said directions. In this embodiment, variation in thickness in radial directions parallel to the surface may be used to compensate for variation in the Young's modulus of the substrate in those directions. Alternatively, such a variation may be exploited to create a band of resonance frequencies, which can be used in a MEMS filter.

In a further embodiment of the MEMS resonator according to the invention, an actuator electrode is located on a sidewall of one of said closed trenches, the actuator electrode being arranged for actuating the resonator. The actuator electrode is advantageously used to actuate a mode shape of the MEMS resonator. This configuration is known as a one-port micromechanical resonator.

In an advantageous improvement of said embodiment, the actuator electrode is provided along the full length of said closed trench. In this embodiment, the vibrating mode is such that the tube expands and contracts synchronously over the full perimeter. This mode shape is also referred to as radial mode shape.

In some embodiments of the MEMS resonator, the actuator electrode is also arranged for sensing movement of the resonator. These embodiments advantageously provide a saving in area as no separate sensing electrode is needed.

Alternatively, in yet another embodiment, a sensing electrode is located on a sidewall of the other of said closed trenches. This configuration is known as a two-port micromechanical resonator. This embodiment needs less complicated steering electronics as the bias voltage can be directly applied to the resonator itself. A further advantage of the two-port configuration is that the electrode-to-resonator capacitor no longer connects the input to the output; in that way, it better isolates the input from the output.

The invention also relates to a method of manufacturing a MEMS resonator. The method according to the invention comprises the following steps:

providing a substrate having a surface;

forming a first closed trench in the substrate;

forming a second closed trench in the substrate, the second closed trench surrounding the first closed trench so as to form a tube structure;

implanting dopant atoms into the substrate for making the resonator structure conductive and for defining an electrode;

providing a dielectric layer on the substrate and on all sidewalls of said trenches;

providing a conductive layer on the substrate and in said trenches;

patterning said conductive layer such that an opening is formed at the location of the tube structure locally exposing the dielectric layer, the patterning further being such that a separate inner electrode inside the first trench and a separate outer electrode inside the second trench are formed;

selectively partially removing the dielectric layer from the opening for forming a first gap between said inner electrode and the tube structure, and for forming a second gap between said outer electrode and the tube structure.

The method of manufacturing according to the invention provides a convenient way of forming a MEMS resonator having a tube structure.

The invention further relates to a MEMS oscillator comprising a MEMS resonator according to the invention. The advantage of such a MEMS oscillator is that it has low phase-noise, and that it provides a high degree of integration due to its low cost and its reduced size.

The invention further relates to an integrating circuit comprising such a MEMS oscillator. The advantage of such an integrated circuit is that the oscillator can be fabricated at the same time as passive and/or active components without the need for an expensive substrate or an expensive additional step of fabrication.

The MEMS resonator according to the invention therefore allows relatively straightforward integration of a monolithic integrated MEMS oscillator.

The invention also relates to a MEMS filter comprising a single MEMS resonator. Such a MEMS filter is less complex than the known MEMS filters, because coupling of separate MEMS resonators for forming a frequency band filter has been rendered superfluous. Using a single MEMS resonator thus saves costs.

Alternatively, the invention relates to a MEMS filter comprising a plurality of MEMS resonators, wherein the MEMS resonators are electrically or mechanically coupled.

Any of the additional features can be combined together and combined with any of the aspects. Other advantages will be apparent to those skilled in the art. Numerous variations and modifications can be made without departing from the claims of the present invention. Therefore, it should be clearly understood that the present description is illustrative only and not intended to limit the scope of the present invention.

How the present invention may be put into effect will now be described by way of example with reference to the appended drawings, in which.

Figure 1A:
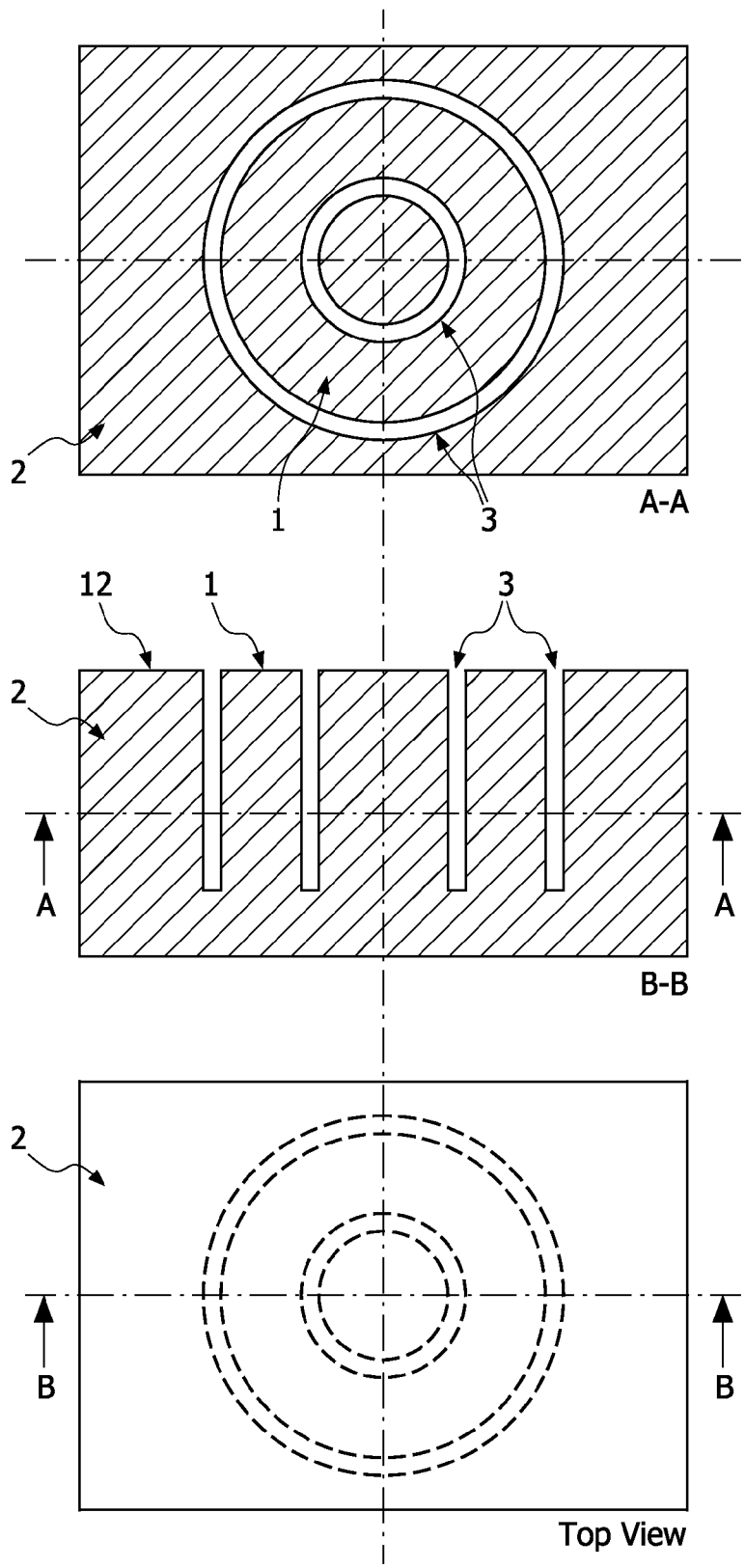
FIGS. 1a-1e illustrate different stages of the method of manufacturing a MEMS resonator according to one embodiment of the invention.

The present invention will be described with respect to particular embodiments and with reference to certain drawings, yet the invention is not limited thereto but only by the claims. Any reference signs in the claims shall not be construed as limiting the scope. The drawings described are only schematic and are non-limiting. In the drawings, the size of some of the elements may be exaggerated and not drawn to scale, for illustrative purposes. Where the term "comprising" is used in the present description and claims, it does not exclude other elements or steps. Where an indefinite or definite article is used when referring to a singular noun e.g. "a" or "an", "the", this includes a plural of that noun unless specifically stated otherwise.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

FIGS. 1a-1e illustrate an advantageous embodiment of the method of manufacturing a MEMS resonator according to the invention, each Figure illustrating a different stage in three different views, being a planar cross-sectional view A-A, a vertical cross-sectional view B-B and a top-view. The method illustrated in these Figures has major advantages. Not only does it provide a very simple MEMS resonator structure, but also it is fully compatible with a known process, called the PICS process. The MEMS resonator can be manufactured in the PICS process with minor modifications of the process, such as selectively partially removing the dielectric layer for forming the gap between the resonator and the electrodes. The PICS process is known to the person skilled in the art, see also F. Roozeboom, et. al., "*More than 'Moore': towards Passive and System-in-Package integration*", Electrochem. Soc. Symp. Proc., Vol. 2005-8, Jun. 2, 2005, p. 16-31.

Please note that the invention is not limited to the embodiment of the method as illustrated in FIGS. 1a-1e. Many variations are possible.

FIG. 1a illustrates a stage of an embodiment of the method according to the invention. In this stage, the resonator structure 1 is vertically defined in a single-crystal silicon substrate 2 having a top surface 12. This is done by means of etching two closed trenches 3, one beside the other. In this particular example, the trenches are both circular and located concentrically with respect to each other, but other shapes and non-concentric locations are also possible. The substrate does not need to be a single-crystal silicon substrate. However, single crystal silicon substrates offer lower internal friction and a higher mechanical quality factor than polysilicon substrates. It is regarded as a great advantage of the invention that any kind of substrate can be used. Even ultra-cheap bulk substrates can be used. In this description, bulk substrates are defined as substrates without any layers of different materials (like oxide layers), substrates with layers (patterned or unpatterned) of different materials, layers having a different structure (like epi-layers), or layers having a different doping (like well regions).

Figure 1B:
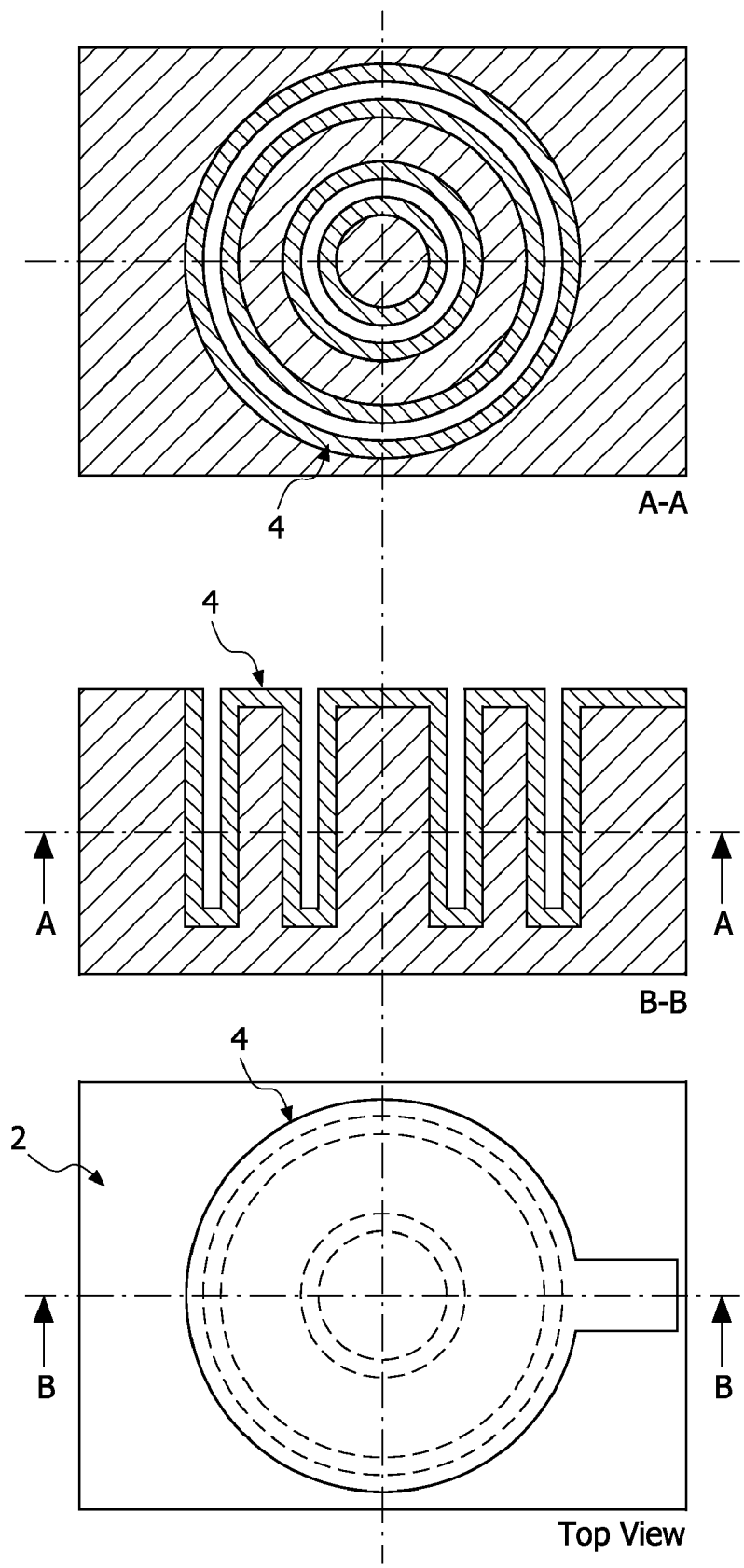

FIG. 1b illustrates another stage of an embodiment of the method according to the invention. In this stage, the silicon substrate 2 is doped for forming a conductive layer 4 on the resonator structure 1, which conductive layer 4 defines an electrode of the MEMS resonator structure. The doping can be chosen such that a (heavily doped) n-type conductive layer 4 is formed. Boron atoms can be used for this purpose. Obviously, p-type dopants are also possible, like phosphorus and arsenic, which will eventually result in a p-type conductive layer 4.

Figure 1C:
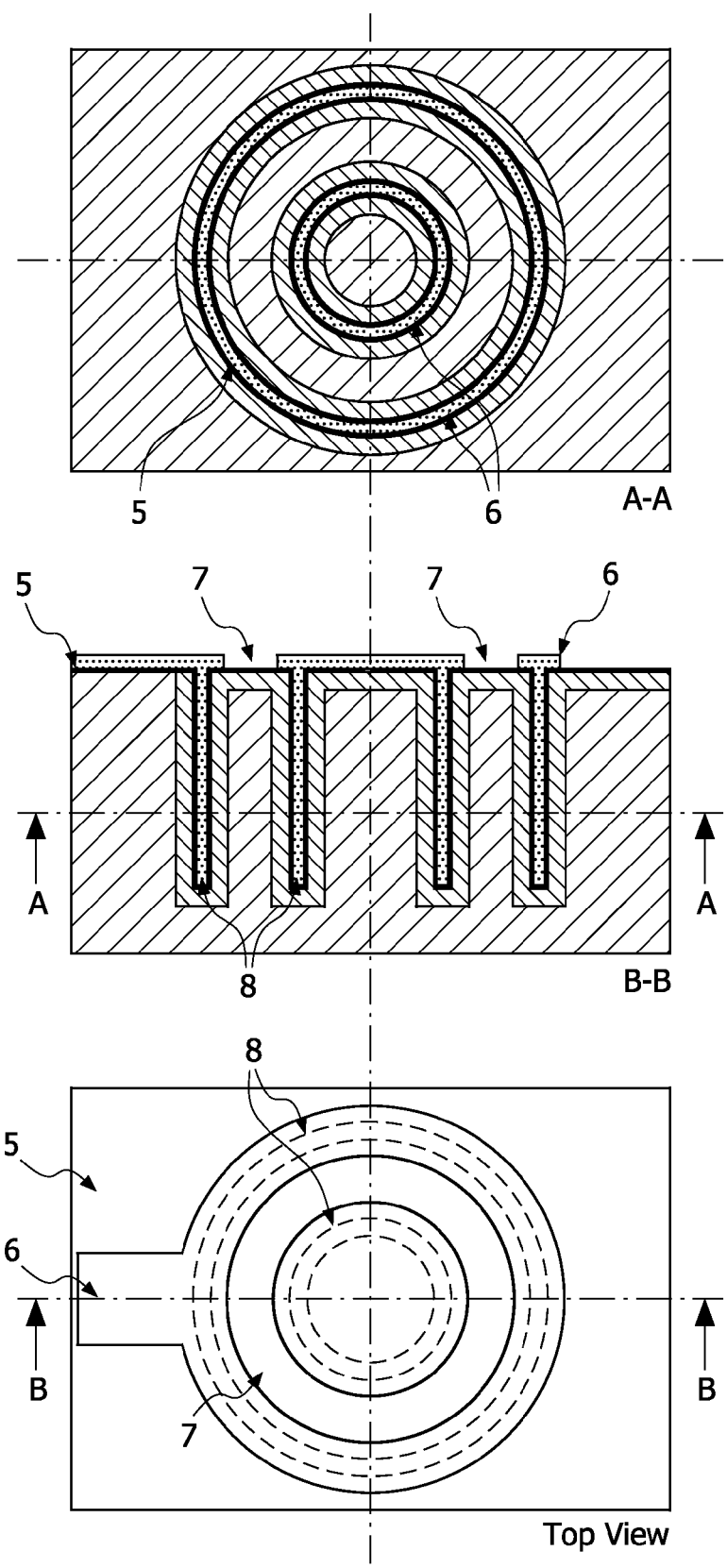

FIG. 1c illustrates another stage of an embodiment of the method according to the invention. In this stage, the trenches 3 are filled with a thin dielectric film 5 and a poly-silicon layer 6. Subsequently, the poly-silicon layer 6 is patterned for defining drive and sense electrodes 8, whereby a circular opening 7 is formed which exposes the underlying dielectric film 5. The dielectric film 5 may comprise materials like silicon oxide, silicon nitride, polyamide and other polymers. The dielectric film 5 may even comprise a stack of layers of different materials, like a silicon oxide/silicon nitride/silicon oxide stack, which is fully PICS-process compliant. The poly-silicon layer 6 may be a doped poly-silicon layer (n-type or p-type). The poly-silicon layer may be substituted with a doped poly-silicon-germanium layer or a metal layer.

Figure 1D:
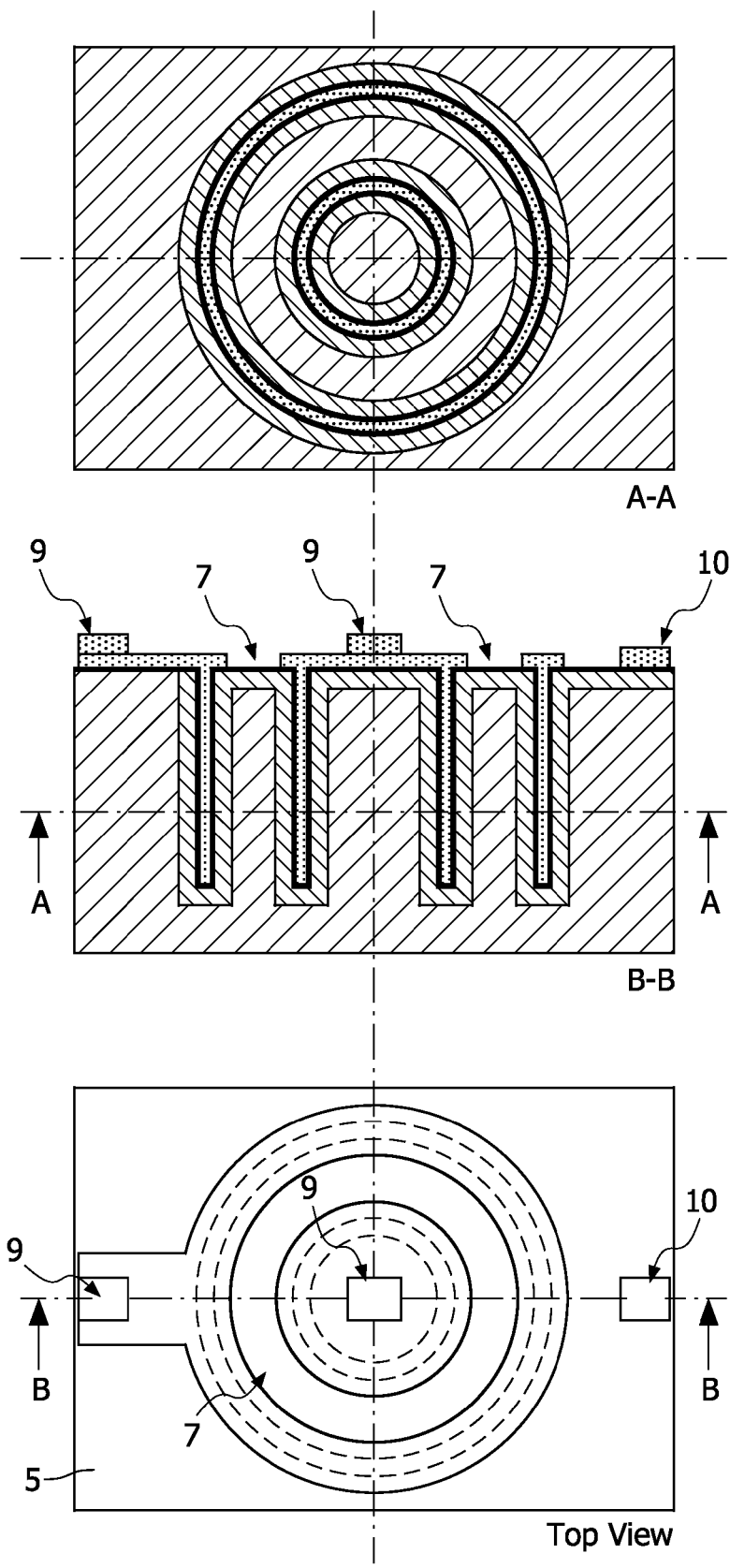

FIG. 1d illustrates another stage of an embodiment of the method according to the invention. In this stage, contacts 9 are formed on the drive and sense electrodes 8. Also, a contact 10 is made to the conductive layer 4. Before this contact 10 is made, the thin dielectric film 5 is locally removed so as to enable electrical contact between the contact 10 and the conductive layer 4. The contacts may comprise different materials, for example aluminum, tungsten, gold, copper, heavily-doped poly-silicon or poly-silicon-germanium.

Figure 1E:
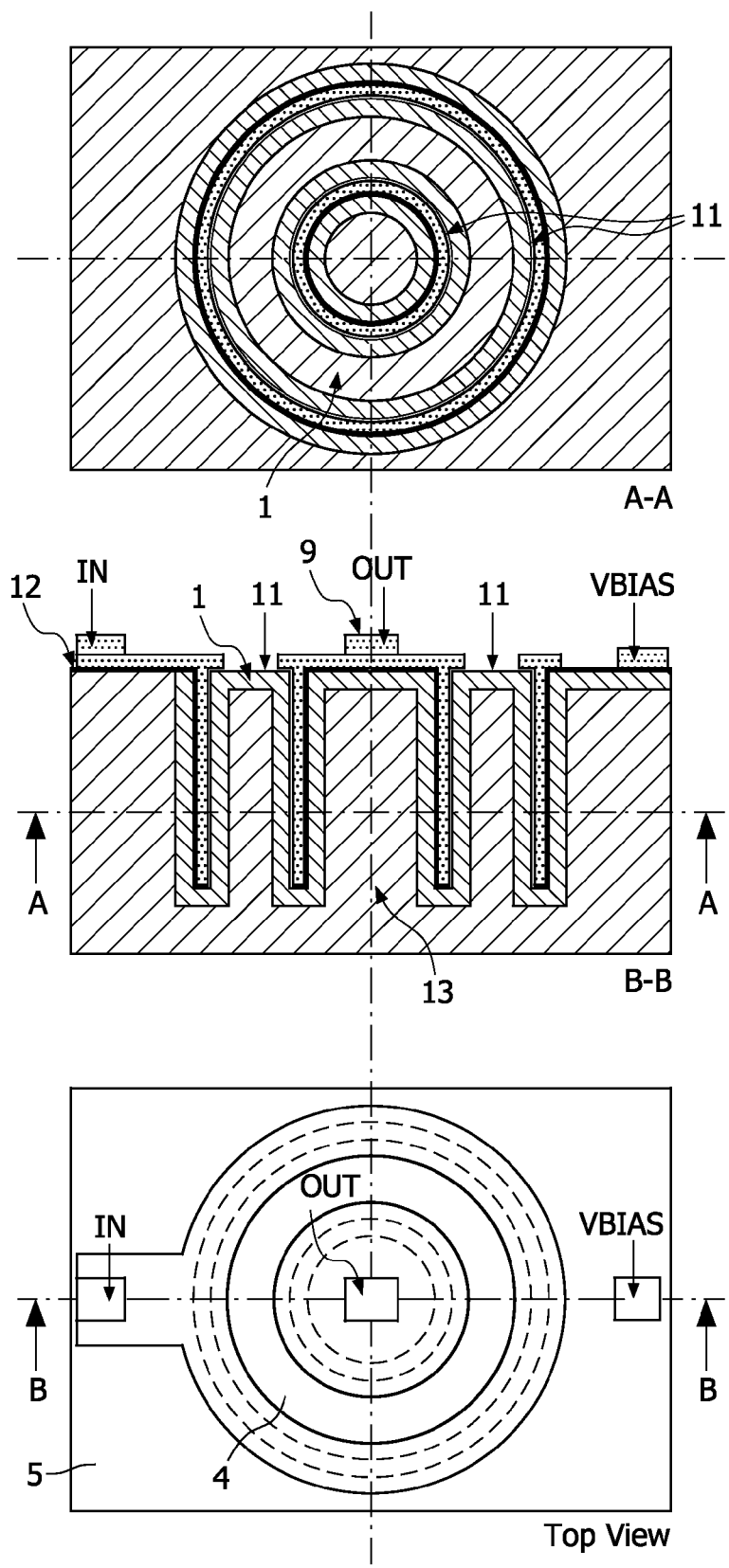

FIG. 1e illustrates another stage of an embodiment of the method according to the invention. In this stage, a mask (not shown in the Figure) is provided on the structure and patterned such that at least the thin dielectric film 5 surrounding the outside of the electrodes 8 is covered. Subsequently, part of the thin dielectric film 5 is selectively removed through the opening 7 in the polysilicon layer 6. This selective removal should be performed during such a period of time that the thin dielectric film 5 is removed on each side of the tube-shaped resonator structure 1 at least down to the bottom of the trenches 3. Thus, during this selective removal (circle-shaped) airgaps 11 are formed on both sides of the tube-shaped resonator structure 1, as a result of which the structure is released in a direction parallel to the original top surface 12. Finally, the mask is removed at the end of this stage.

It does not matter if the removal takes a little bit longer so as to remove more of the dielectric film 5, as this only means that part of the electrodes near the bottom of the trench will be released on both sides thereof.

Selective (partial) removal of layers is a technique well-known to the skilled person and can be performed using a wet etching step, for example. However, other techniques are also possible.

The method of manufacturing a MEMS resonator as illustrated in FIGS. 1a-1e is only one embodiment of the method according to the invention. The illustrated process is compatible with the PICS process, but many variations are possible within the scope of the invention (obviously making the process less compatible with the PICS process). For example, different shapes of the trenches 3 are possible, such as elliptic, square, triangular, rectangular, and other shapes. These different shapes of the trenches 3 will result in different shapes of the resonator structure 1. These different shapes of the resonator structure 1 may be exploited to compensate for differences in the Young's modulus of the material (in different directions) or to create a frequency band in which the MEMS resonator can be used as a filter. This is possible even without changing the PICS process.

In this particular example, the outer electrode is the input/actuation electrode IN and the inner electrode is the output/sensing electrode OUT. The third electrode, which is connected to the conductive layer 4, is the bias electrode VBIAS. The support structure (also called anchor) 13 of the MEMS resonator is defined by the bottom of the tube structure, where it is attached to the substrate 2.

The feasibility of the tube-shaped MEMS resonator 1 has been verified using calculations and a modal analysis by means of simulations. The resonator, which was modeled and simulated, comprises a tube resonator structure 1 anchored at its bottom, an electrode 8 surrounding the outer surface of the resonator structure 1, and possibly another electrode 8 facing the inner surface of the resonator structure 1. In this particular implementation, the dimensions of the tube structure 1 were chosen as follows:

Height of the tube structure=30 µm;
Thickness of the tube structure=10 µm;
Average radius of the tube structure=55 µm; and
Air gap thickness (between each electrode and the tube structure)=35 nm.

The thickness of the tube structure 1 is defined in all radial directions parallel to the surface 12 in FIG. 1a. In other words, directions parallel to the surface 12 and perpendicular to the tube structure 1.

The tube-shaped MEMS resonator works as follows. When a voltage is applied between the outer electrode IN and the electrode VBIAS of tube structure 1, a radial force is generated on the outer surface of the tube structure 1 that tends to extend the tube structure 1 in all radial directions. In consequence, the vibrating mode we actuate is the expansion and the contraction of the tube upper part. The other electrode (OUT) can be used to sense the movement of the resonator structure 1.

Please note that the mode-shape is a function of the axis in the direction parallel to the tube. Close to the bottom of the resonator structure 1, also called the anchor 13, the extension/contraction is the smallest (approaching zero at the anchor 13), and close to the top of the resonator structure 1 the extension/contraction is the largest. In fact this mode-shape of the tube-shaped resonator structure 1 could be regarded as a combination of an extensional, radial (in the plane parallel to the surface 12), flexural mode shape(?) of the resonator structure 1. In the case of electrodes, which are not completely surrounding the resonator structure, even contour modification of the resonator structure is feasible. More information about contour modification of resonators can be found in the following reference: Zhili Hao, et. al. "*VHF Single-Crystal Silicon EllipticBulk-Mode Capacitive Disc Resonators—Part I: Design and Modeling*", Journal of Microelectromechanical Systems, Vol. 13, No. 6, December 2004, p. 1043-1053

To demonstrate the feasibility of the resonator, the FEA software tool "ANSYS" has been used. The model built was based on the following constants/parameters:

TABLE 1

Constants/parameters used for simulations and calculations

| Constant/Parameter | Notation | Value |
| --- | --- | --- |
| Young's Modulus | E | 150 GPa |
| Minor Poisson's Ratio | ν | 0.3 |
| Density | ρ | 2330 kg/m³ |

TABLE 1-continued

Constants/parameters used for simulations and calculations

| Constant/Parameter | Notation | Value |
| --- | --- | --- |
| Free-space Permittivity | $\epsilon_0$ | 8.854e−12 F/m |
| Relative Permittivity | $\epsilon_r$ | 1 |
| Tube Height | L | 30 µm |
| Tube Thickness | T | 10 µm |
| Tube average Radius | R | 55 µm |
| Air Gap Thickness | d | 35 nm |

The average tube radius is defined as the average of the inner radius (50 µm in this example) and the outer radius (60 µm in this example) of the tube structure.

Figure 2A:
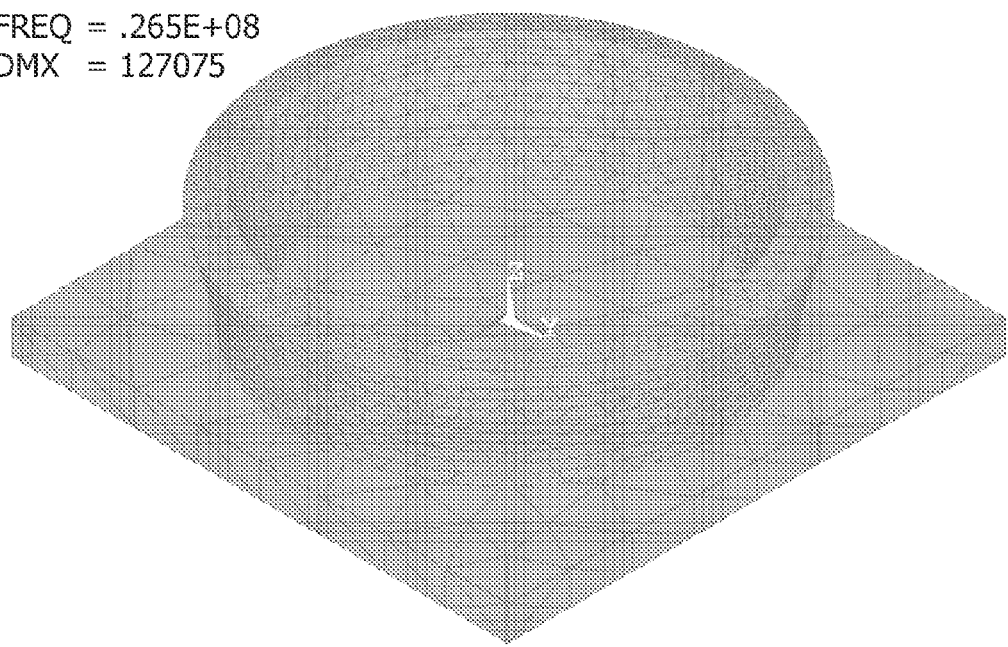
FIGS. 2a and 2b illustrate simulated states of a first embodiment of the tube-shaped MEMS resonator, which is in oscillation.
Figure 2B:
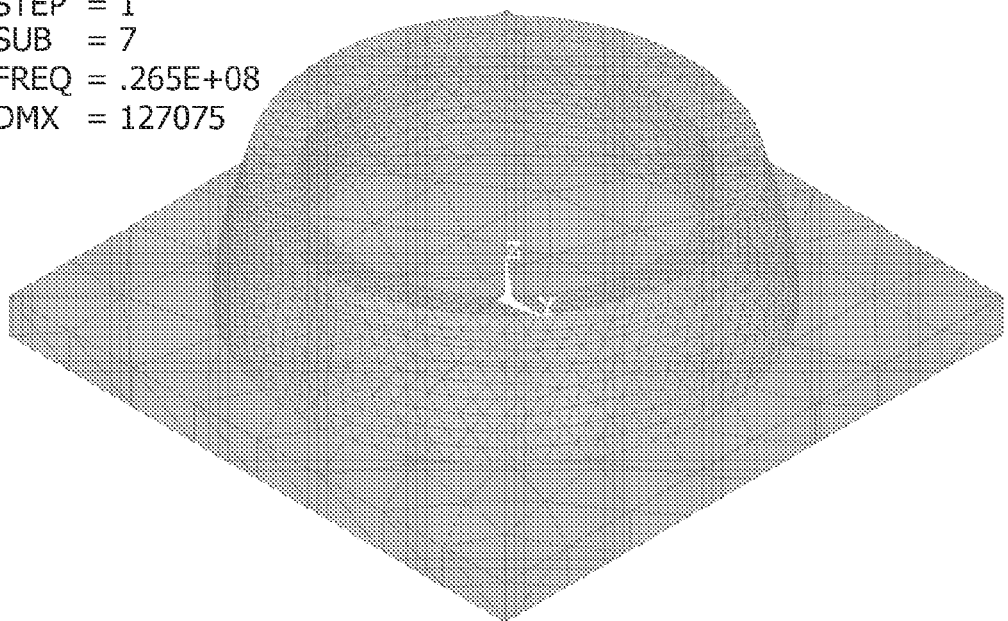

A modal analysis shows the frequency for the considered dimensions and vibrating mode, which is 26.5 MHz. FIGS. 2a and 2b illustrate simulated states of this tube-shaped MEMS resonator in oscillation. The electrodes are not shown in the Figure.

Theory and ANSYS simulation show that the resonance frequency of the MEMS resonator is reduced when the tube height or its radius increases, whereas it increases with the tube width. The resonance can thus be adjusted by modifying dimensions. Nevertheless, it is essential that the height is at least two to three time the width.

For this type of MEMS resonators, the power handling and the motional resistance can be deduced. The power handling $P_{max}$ is given by:

$$P_{max} = \frac{\omega_0 \cdot k_r \cdot X_{max}^2}{Q}$$

where $\omega_0$, $k_r$, $X_{max}$, and Q are the angular resonant frequency, the relative stiffness, the maximum vibration amplitude and the quality factor, respectively.

Using this formula, the power handling can be estimated as follows. The relative stiffness $k_r$ is assumed to be equal to the static stiffness k. The maximum vibration amplitude $X_{max}$ is fixed to 10 nm and the quality factor Q to 4000. Entering these figures into the formula leads to a power handling of $P_{max}$=20 µW. This value is in the same order of magnitude as the best results found in literature so far.

The motional resistance $R_x$ is given by:

$$R_x = \frac{\omega_0 \cdot m_r}{Q \cdot \eta^2}$$

where $m_r$, and η are the relative mass and the electromechanical coupling coefficient, respectively.

The electromechanical coupling coefficient is equivalent to:

$$\eta = \varepsilon_0 \cdot \varepsilon_r \cdot V_p \frac{2\pi(R+T/2)L}{d^2}$$

where $V_p$, $\epsilon_0$, $\epsilon_r$, L, T, R, d are the polarization voltage, free-space permittivity, relative permittivity, tube height, tube thickness, tube average radius, air gap thickness, respectively.

The structural mass is estimated with the following formula:

$$m_r = \rho \cdot 2\pi \cdot R \cdot T \cdot L$$

where ρ, L, T, R are the density, tube height, tube thickness, tube average radius, respectively.

The polarization voltage $V_p$ is estimated to be 1 Volt. Entering these figures in the formula for the motional resistance $R_x$ results in a value of 1.5 kΩ. This value is in the same order of magnitude as the best results found in literature so far.

The person skilled in the art can optimize the motional resistance $R_x$ and the power handling $P_{max}$ by adjusting the tube radius R, the tube thickness T, and also its height L.

Figure 3A:
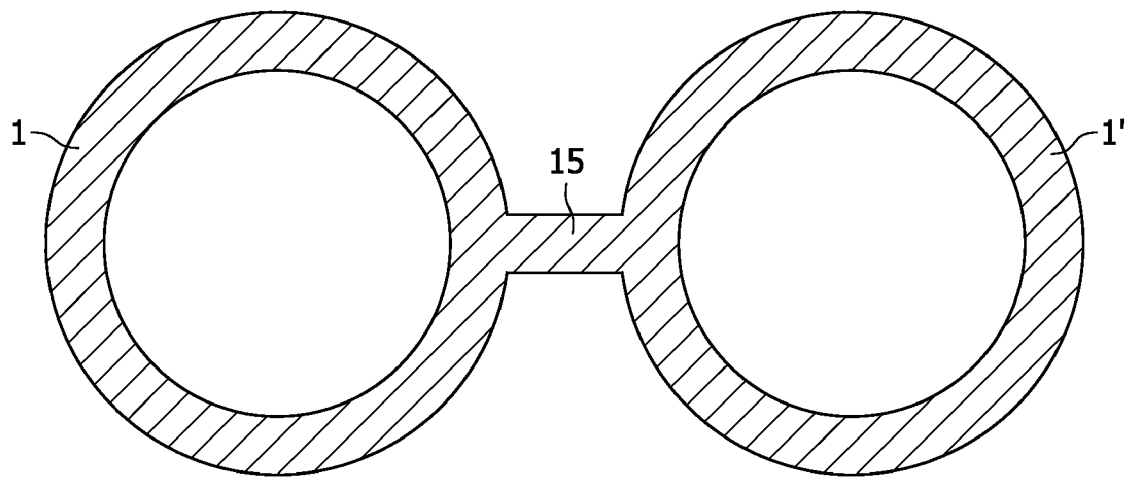
FIGS. 3a and 3b illustrate two different ways of coupling separate MEMS resonators together.
Figure 3B:
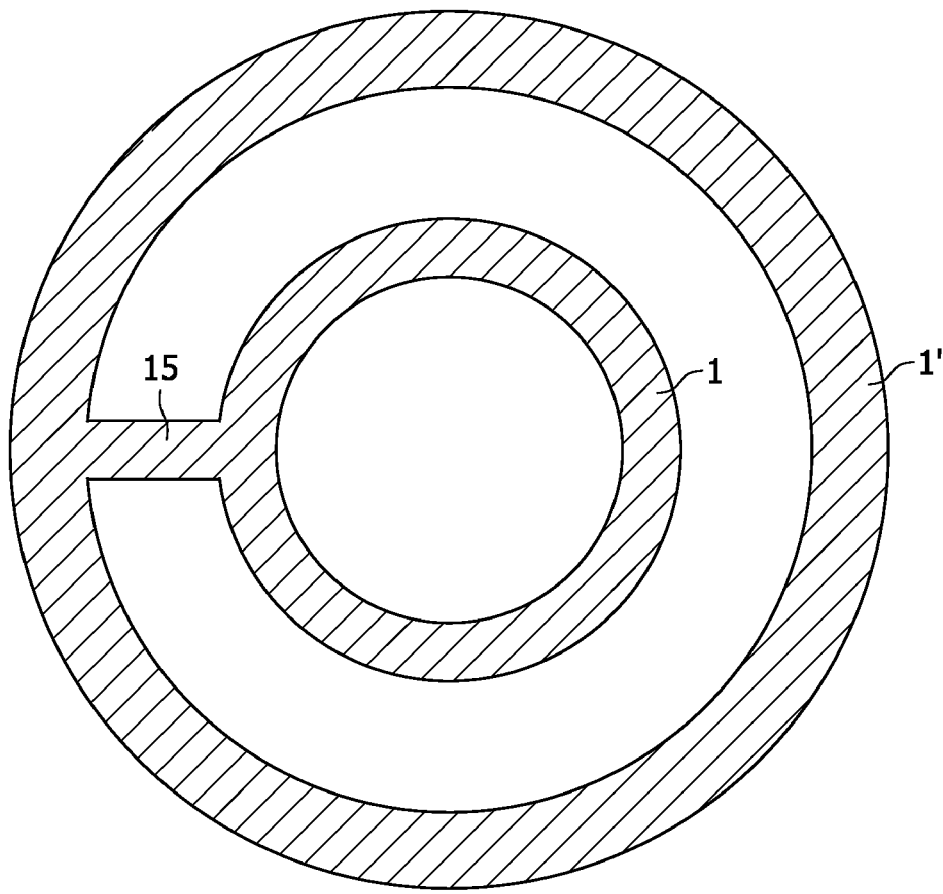

FIGS. 3a and 3b illustrate a schematic top view of two different ways of mechanically coupling two resonators to each other. Coupling multiple resonators is generally done for creating filters. In that case, each resonator filter is designed to filter its own frequency or frequency band. In FIGS. 3a and 3b only the resonator structures are (schematically) shown. In FIG. 3a, a first resonator structure 1 and a second resonator structure 1' are provided next to each other, wherein a mechanical coupling device 15 couples both structures. In FIG. 3a, the resonator structures are drawn to have equal sizes, but that is not necessary. In fact, all parameters of the second resonator structure 1' can be different from the first resonator structure 1, so as to make sure that the second resonator structure oscillates/filters at a different frequency. In FIG. 3b, the first resonator structure 1 and the second resonator structure 1' are arranged one inside the other, and are coupled to one another by the mechanical coupling device 15.

As an alternative to mechanical coupling, electrical coupling of multiple resonators has been done. Both mechanical coupling and electrical coupling are well known to the person skilled in the art, see Siavash Pourkamali, et al. *"Electrostatically coupled micromechanical beam filters"*, Micro 17th IEEE International Conference on Electro Mechanical Systems, 2004, p. 584-587, and also Frank D. Bannon, III, et al. *"High-Q HF Microelectromechanical Filters"*, IEEE Journal of Solid-State Circuits, Vol. 35, No. 4, April 2000, p. 512-526.

Figure 4A:
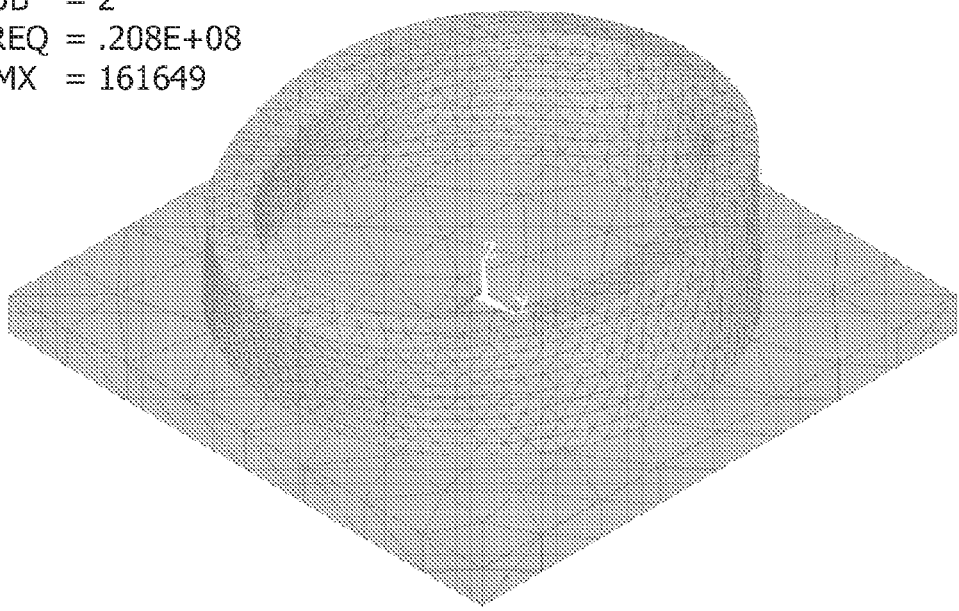
FIGS. 4a and 4b illustrate simulated states of a second embodiment of the tube-shaped MEMS resonator, which is in oscillation.
Figure 4B:
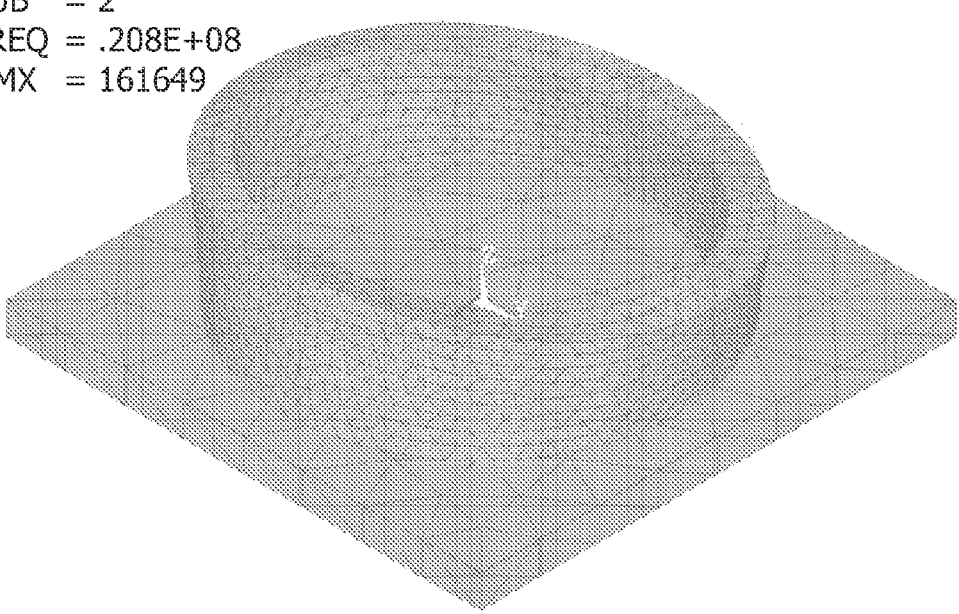

FIGS. 4a and 4b illustrate simulated states of a second embodiment of the tube-shaped MEMS resonator in oscillation. In this embodiment, the resonator operates at another mode-shape corresponding to another eigenmode. As an example, the resonator sensitivity to this mode-shape can be accentuated by designing the electrodes (not shown) such that they do not completely surround the tube structure. Instead, they are split and provided on two opposite sides of the tube structure. In one direction (e.g. the X-direction in FIG. 4a), the tube structure expands, while in the other direction (e.g. the Y-direction in FIG. 4a) the tube structure contracts, forming an elliptic mode shape which is illustrated in FIG. 4a. Then, the tube structure will contract in the one direction (X-direction in FIG. 4b) and expand in the other direction (Y-direction in FIG. 4b), forming an opposite elliptic mode shape which is illustrated in FIG. 4b.

Figure 5A:
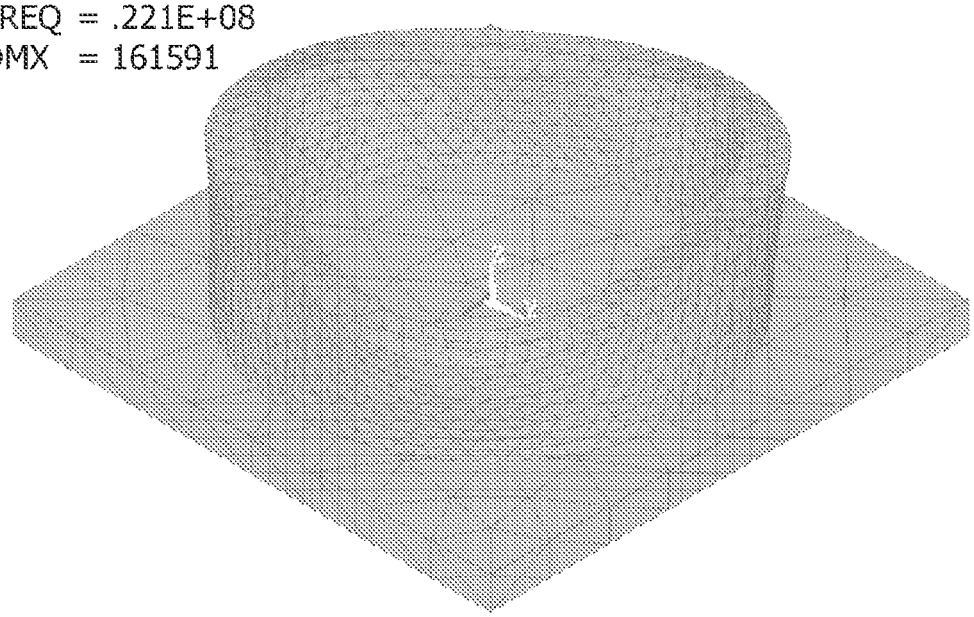
FIGS. 5a and 5b illustrate simulated states of a third embodiment of the tube-shaped MEMS resonator, which is in oscillation.
Figure 5B:
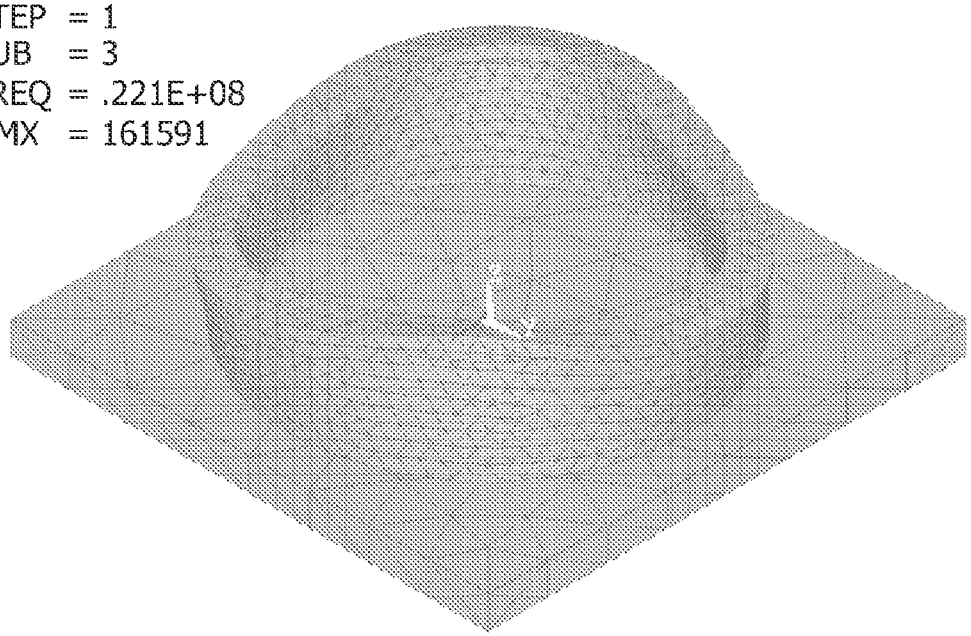

FIGS. 5a and 5b illustrate simulated states of a third embodiment of the tube-shaped MEMS resonator in oscillation. In this embodiment, the resonator operates at another mode-shape corresponding to another eigenmode. As an example, the resonator sensitivity to this mode-shape can be accentuated by designing the electrodes (not shown) such that they also do not completely surround the tube structure. Instead, three actuation electrodes are provided so as to be distributed at equal distances around the tube structure. In one state (see FIG. 5a), the tube structure expands in the directions where the electrodes are located, while in the other directions (in between these electrodes) the tube structure contracts. In the other state (see FIG. 5b), the tube structure's expansion and contraction is exactly reversed.

The invention thus provides an attractive MEMS resonator having a comparable performance (in terms of power handling and motional resistance) to the best figures reported in literature.

Some embodiments of the MEMS resonator according to the invention are particularly suitable for frequencies in the range of 10-50 MHz when manufactured in bulk substrates. At the same time, these embodiments maintain a good performance (high power handling and low motional resistance).

The invention also provides a method of manufacturing such a MEMS resonator, which method can be easily made compatible with known processes like the PICS process.

Although the word MEMS resonator device is used in the claims, the invention is not restricted to resonators and oscillators only. The resonator device can also be applied in MEMS filter devices.

The invention claimed is:

1. A MEMS resonator having at least one resonator mode shape, the MEMS resonator comprising a substrate having a surface, and a resonator structure, characterized in that the resonator structure is part of the substrate, and further characterized in that the resonator structure is defined by a first closed trench and a second closed trench, the first trench being located inside the second trench so as to form a tube structure inside the substrate, and the resonator structure being released from the substrate only in directions parallel to the surface.

2. A MEMS resonator as claimed in claim 1, characterized in that the first closed trench and the second closed trench have a circular shape so as to form a circular tube structure.

3. A MEMS resonator as claimed in claim 2, characterized in that the first closed trench and the second closed trench are located concentrically with respect to each other so as to form the tube structure in such a manner that it has a constant thickness in all radial directions parallel to the surface.

4. A MEMS resonator as claimed in claim 1, characterized in that the height of the tube structure, the height being defined by the depth of said first and second closed trenches, is more than two times the thickness of the tube structure.

5. A MEMS resonator according to claim 1, characterized in that the first and second closed trenches are non-circular so as to form a tube structure having a varying thickness in radial directions parallel to the surface for compensating for a difference in the Young's modulus of the substrate material in said directions.

6. A MEMS resonator as claimed in claim 1, characterized in that an actuator electrode is located on a sidewall of one of said closed trenches, the actuator electrode being arranged for actuating the resonator.

7. A MEMS resonator as claimed in claim 6, characterized in that the actuator electrode is provided along the full length of said closed trench.

8. A MEMS resonator as claimed in claim 6, characterized in that the actuator electrode is also arranged for sensing movement of the resonator.

9. A MEMS resonator as claimed in claim 6, characterized in that a sensing electrode is located on a sidewall of the other of said closed trenches.

10. A MEMS oscillator comprising a MEMS resonator as claimed in claim 6.

11. A MEMS filter comprising a single MEMS resonator as claimed in claim 6.

12. A method of manufacturing a MEMS resonator having at least one mode shape comprising the following steps:

provacing a substrate having a surface;

forming a first closed trench in the substrate;

forming a second closed trench in the substrate, the second closed trench surrounding the first closed trench so as to form a tube structure;

implanting dopant atoms into the substrate for making the resonator structure conductive and for defining an electrode;

providing a dielectric layer on the substrate and on all sidewalls of said trenches;

providing a conductive layer on the substrate and in said trenches;

patterning said conductive layer such that an opening is formed at the location of the tube structure locally exposing the dielectric layer, the patterning further being such that a separate inner electrode inside the first trench and a separate outer electrode inside the second trench are formed;

selectively partially removing the dielectric layer from the opening for forming a first gap between said inner electrode and the tube structure, and for forming a second gap between said outer electrode and the tube structure.

* * * * *